(12) United States Patent
Lin et al.

(10) Patent No.: US 7,879,438 B2
(45) Date of Patent: Feb. 1, 2011

(54) SUBSTRATE WARPAGE-REDUCING STRUCTURE

(75) Inventors: Jyh-Rong Lin, Tucheng (TW); Bin Xie, Fanling (HK); Yeung Yeung, Kowloon (HK); Xunqing Shi, Taiwai (HK); Chang Hwa Chung, Shatin (HK)

(73) Assignee: Hong Kong Applied Science and Technology Research Institute Co., Ltd., Shatin, New Territories (HK)

( * ) Notice: Subject to any disclaimer, the term of this patent is extended or adjusted under 35 U.S.C. 154(b) by 0 days.

(21) Appl. No.: 12/412,114

(22) Filed: Mar. 26, 2009

(65) Prior Publication Data

US 2010/0247879 A1 Sep. 30, 2010

(51) Int. Cl.
*B32B 9/00* (2006.01)
(52) U.S. Cl. .................. 428/210; 428/325; 428/209; 501/32; 361/319; 156/89.11
(58) Field of Classification Search .......... 428/210, 428/325, 209; 156/89.11; 501/32; 361/319
See application file for complete search history.

(56) References Cited

U.S. PATENT DOCUMENTS

| 3,558,346 | A | | 1/1971 | Plumley |
| 4,396,682 | A | * | 8/1983 | Mohri et al. ............... 428/428 |
| 4,634,634 | A | * | 1/1987 | Kondo et al. ............... 428/432 |
| 6,697,324 | B2 | * | 2/2004 | Tajima et al. ............... 369/283 |
| 2006/0112873 | A1 | | 6/2006 | Uchida et al. |
| 2008/0131634 | A1 | | 6/2008 | Kiuchi et al. |

FOREIGN PATENT DOCUMENTS

KR 100759087 B1 9/2007

OTHER PUBLICATIONS

International Search Report and the written opinion of the international searching authority, or the declaration dated Jan. 7, 2010 for PCT/CN2009/071115 in 14 pages.

* cited by examiner

*Primary Examiner*—Cathy Lam
(74) *Attorney, Agent, or Firm*—Berkeley Law & Technology Group, LLP

(57) ABSTRACT

The subject matter disclosed herein relates to methods to reduce warpage of a substrate.

8 Claims, 8 Drawing Sheets

US 7,879,438 B2

SUBSTRATE WARPAGE-REDUCING STRUCTURE

FIELD

The subject matter disclosed herein relates to methods to provide warpage control of a substrate.

BACKGROUND

For thin-film based processes, flatness of a substrate is typically an important factor in achieving high production yield for such products as integrated circuit modules, for example. Warpage of such a substrate may lead to substantial variation in alignment of via stacking, and/or capacitor or inductor values, just to name a few adverse effects. Accordingly, a warped substrate may not be suitable for thin-film processes involving fine line width/space design, such as a 10 micrometer/10 micrometer design, to list a particular example.

BRIEF DESCRIPTION OF THE DRAWINGS

Non-limiting and non-exhaustive embodiments will be described with reference to the following objects, wherein like reference numerals refer to like parts throughout the various objects unless otherwise specified.

DETAILED DESCRIPTION

Figure 2:
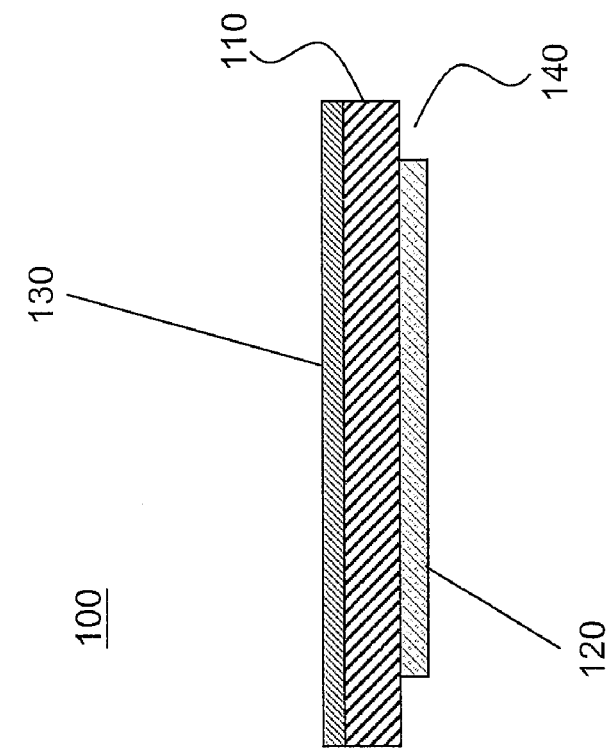
FIG. 2 is a cross-sectional view along line A-A' of the multi-layer substrate structure shown in FIG. 1, according to an embodiment.

In the following detailed description, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification are not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

Likewise, the terms, "and," "and/or," and "or" as used herein may include a variety of meanings that also is expected to depend at least in part upon the context in which such terms are used. Typically, "or" as well as "and/or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe some combination of features, structures, or characteristics.

In an embodiment, a surface-modifying material, such as aluminum oxide and silicon oxide for example, may be applied to one or more surfaces of a semiconductor substrate, such as an as-fired ceramic substrate (e.g., Al2O3 or AlN), to reduce the degree of roughness of the substrate's surface for a thin-film related process. Such a roughness, for example, may arise from a relatively inexpensive process to produce a substrate that involves a sintering process. Unfortunately, such a process may result in a substantial substrate surface roughness on which thin film circuitry may be relatively difficult to form, for example. Such a substrate with multiple structures, however, like many such multilayer structures, may be subject to warping during temperature changes. Warpage, e.g., a degree by which a structure warps, may occur if a multilayer structure undergoing a temperature change comprises layers having different coefficients of thermal expansion (CTEs). For example, a structure comprising a substrate and a surface-modifying material may have different CTEs. In a particular example, a silicon substrate may have a CTE of 2 to 4 parts per million (ppm)/degree C, whereas SiO2 may have a lower CTE of 0.5 to 1 ppm/degree C. In another particular example, a CTE of a substrate having 96% alumina may be 7~8 ppm/degree C., and a CTE of a surface-modifying material may be 5~10 ppm/degree C. Thus, such a structure may warp during a process of cooling the structure from a high temperature state to a normal (i.e., ambient) temperature state. In a particular example, if a thermal contraction of the substrate is higher than that of the surface-modifying material during such a cooling process, that is, if the CTE of the substrate is higher than that of the surface-modifying material, then the substrate side of the structure may warp concavely and the surface-modifying material side may warp convexly. A direction and degree of such warpage may be determined by the rigidity and other characteristics of the substrate and the surface-modifying material, and also by process and structure parameters such as film thickness and/or forming temperature, for example.

While a surface-modifying material may be applied to one or more surfaces of a semiconductor substrate to reduce warpage of a substrate, e.g., an as-fired Alumina ceramic substrate, as explained above, such a material may also be judiciously applied to the substrate to form a multilayer structure that is subject to relatively low warpage for a given temperature change. In an embodiment, such a surface-modifying material applied to a substrate surface may comprise a particular pattern to reduce the degree to which the substrate may warp during a temperature change. Modeling and/or simulation of material properties of the substrate and the surface-modifying material, for example, may be used to determine the shape and/or dimensions relative to the substrate of such a pattern that may reduce warpage. Such properties may comprise CTE, physical dimensions of the materials, temperature changes, tensile and/or compression stresses, and directions of such stresses, just to name a few examples. Other material properties may comprise elastic modulus, Poisson's ratio, and CTE of combined substrate and surface-modifying material. Such material properties may be temperature-dependent. Such a multilayer structure may comprise a substrate and a surface-modifying material on one or both sides of the substrate, wherein the surface-modifying material on one or both sides of the substrate may be patterned to reduce, control, limit, and/or minimize warpage during temperature changes. Such a multilayer structure may also comprise a substrate having a pre-cut structure on a top or bottom surface and a surface-modifying material on one or both sides of the pre-cut substrate. Surface-modifying material may be applied to a substrate and patterned by a lithography process and/or a printing process, for example.

Figure 1:
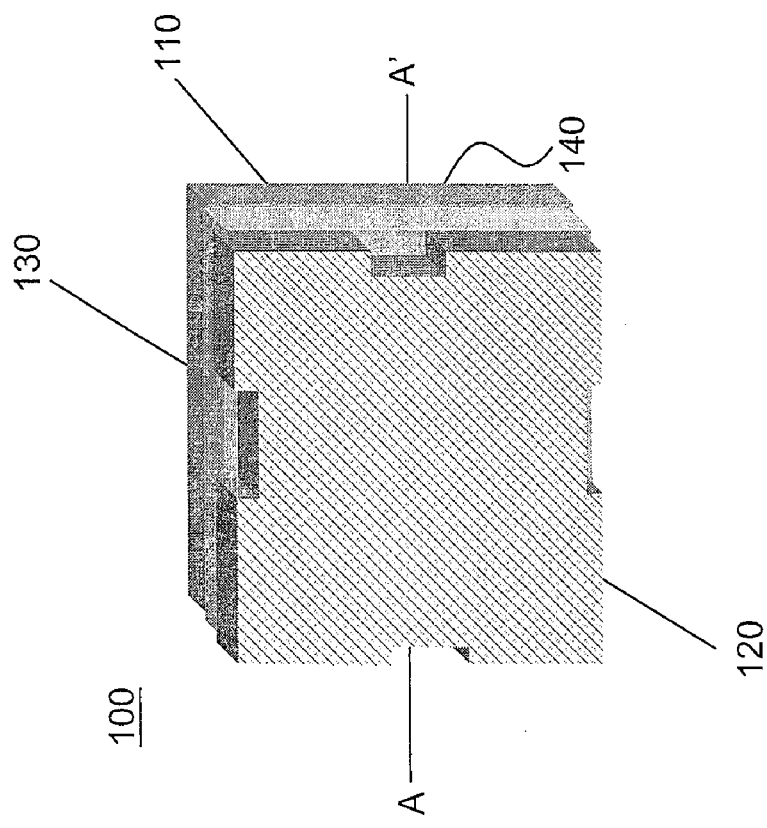
FIG. 1 is a perspective view of a substrate with surface modification layers on both sides, according to an embodiment.

FIG. 1 is a perspective view of a multi-layer substrate structure 100, according to an embodiment, and FIG. 2 is a cross-sectional view along line A-A' of the multi-layer substrate structure shown in FIG. 1. Such a structure may comprise a substrate 110 having a first surface-modifying material 120 applied to one surface and a second surface-modifying material 130 applied to an opposite surface, wherein such surface-modifying layers may comprise a designed pattern on one or both surfaces of substrate 110. First and second surface-modifying materials 120 and 130 may comprise the same or different materials. Such materials may comprise ceramic-based materials, such as aluminum oxide and silicon oxide, polymer-based materials, such as BCB, which comprises a type of polymer-based material that may be used as a dielectric material for wafer-level related packaging process, for example. and thermal conductive epoxy, and/or metal-based materials, such as electro-plating copper and solder, just to name a few examples. Similarly, patterns, thicknesses, structures, and/or shapes of the first surface-modifying material 120 may be the same as, or different from, the second surface-modifying material 130. For example, surface-modifying material 120 may comprise a constant thickness, whereas surface-modifying material 130 may comprise a varying thickness, having a maximum thickness along its periphery and a minimum thickness at its center. Of course, such a thickness distribution is merely an example, and claimed subject matter is not so limited. A selection of materials and/or thicknesses of surface-modifying materials may be performed using modeling and/or simulation of material properties of the substrate and the surface-modifying material in order to reduce warpage, as mentioned above. First surface-modifying material 120 may comprise a pattern that includes one or more recesses 140, for example. Dimensions and positioning on a substrate of such a pattern feature may vary from one portion of the substrate to another. For example, recess 140 on one substrate edge may have a different size than a recess 140 on another substrate edge, though claimed subject matter is not so limited.

Processes to apply surface-modifying materials to a substrate may comprise chemical vapor deposition (CVD), lithography, printing, and/or ink jet printing, just to name a few examples. Patterning of the surface-modifying materials may be implemented by covering a substrate with surface-modifying material, and then selectively masking and etching away portions of the surface-modifying material using for example reactive ion etching (RIE). On the other hand, patterning may be implemented using wet etching that employs resist masking. Returning to FIG. 1, such processes used to apply first and second surface-modifying materials 120 and 130 to substrate 110 may be the same or different.

Figure 3:
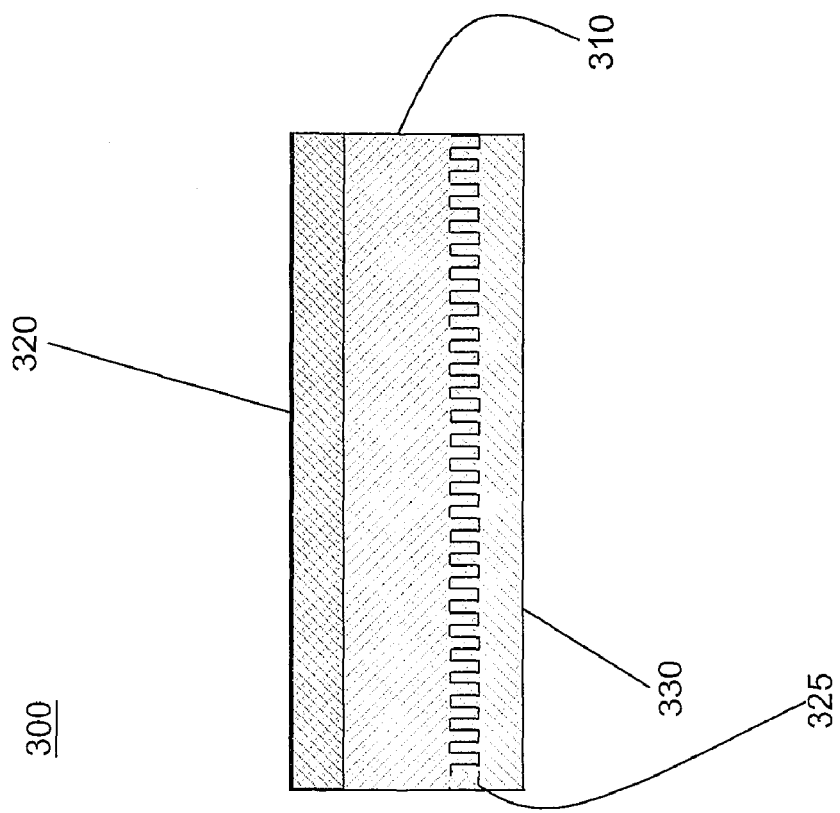
FIG. 3 is a cross-sectional view of a pre-cut substrate structure, according to an embodiment.

FIG. 3 is a cross-section view of a pre-cut substrate structure 300, according to an embodiment. Such a structure, which may comprise a substrate 310 having a first surface-modifying material 320 applied to one surface and a second surface-modifying material 330 applied to another surface having grooves 325, may be referred to as a pre-cut substrate structure. Grooves may be formed on an opposite side of substrate 310 to where thin film structures (not shown), such as micro-circuitry, may be formed.

Figure 4:
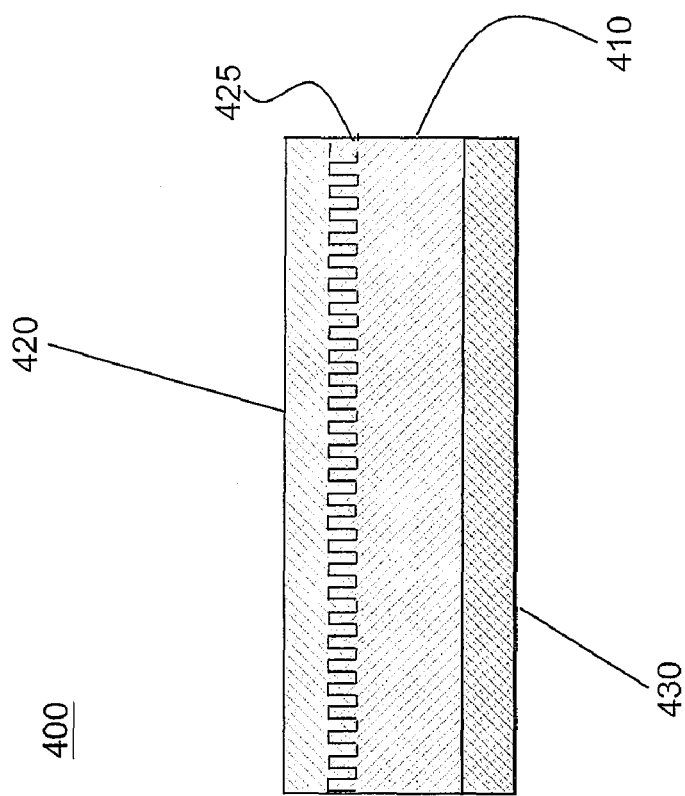
FIG. 4 is a cross-sectional view of a pre-cut substrate structure, according to another embodiment.

Materials used for the first and second surface-modifying materials 320 and 330 may be the same or different. Similarly, patterns, thicknesses, structures, and/or shapes of the first and second surface-modifying materials 320 and 330 may be the same or different. In a particular embodiment, substrate 310 may undergo one or more processes to form grooves 325, such as masking and etching for example, before second surface-modifying material 330 is applied to fill and/or cover grooves 325. A substrate having grooves may reduce the rigidity of the substrate which may be helpful for controlling warpage of a relatively soft material, such as BCB, that is coating a relatively rigid substrate, such as an alumina ceramic substrate, for example. Dimensions of such grooves may include a depth and/or width of 50 micrometers, just to name a particular example. Of course, claimed subject matter is not so limited. Of course, such a description of grooves 325 is merely an example, and claimed subject matter is not so limited. FIG. 4 is a cross-section view of a pre-cut substrate structure 400, according to another embodiment, wherein grooves 425 may be formed on a side of substrate 410 where thin film structures (not shown), such as micro-circuitry, may be formed. As for the embodiment shown in FIG. 3, materials used for first and second surface-modifying materials 420 and 430 may be the same or different. Similarly, patterns, thicknesses, structures, and/or shapes of the first and second surface-modifying materials 420 and 430 may be the same or different. In a particular embodiment, substrate 410 may undergo one or more processes to form grooves 425, such as masking and etching for example, before first surface-modifying material 420 is applied to fill and/or cover grooves 425.

Figure 5:
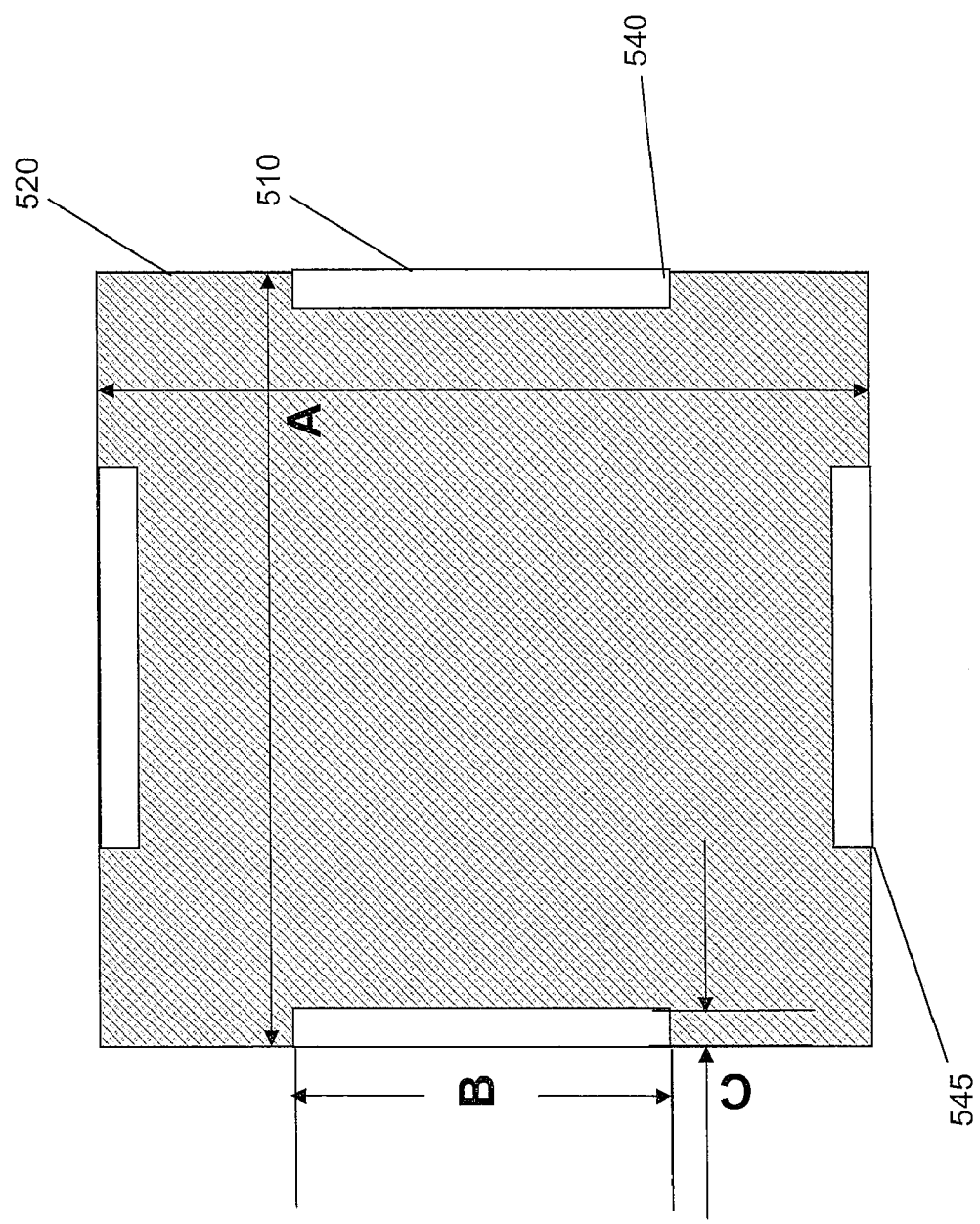
FIG. 5 is a plan view of a substrate structure including a surface-modifying material, according to an embodiment.

FIG. 5 is a plan view of a substrate structure 500 including a patterned surface-modifying material 520 applied to a substrate 510, according to an embodiment. Surface-modifying material 520 may comprise a pattern that includes one or more recess portions 540 and 545, for example. Dimensions and positioning on a substrate of such pattern features may vary from one portion of the substrate to another. For example, recess portion 540 may have a different size than recess 545, though claimed subject matter is not so limited. In one particular embodiment, one or more recesses need not be limited to being located along an edge of substrate 510. For example, one or more recesses may be located in a middle region of substrate 510. Dimensions of recesses 540 and 545, such as length B and depth C relative to substrate size A, for example, may be selected to reduce, control, and/or limit warpage of substrate structure 500. Such a selection may be performed using various modeling processes, as mentioned above. For example, such a modeling process may consider CTEs of substrate 510 and surface-modifying material 520, temperatures to which substrate structure 500 may be subjected during a manufacturing process, and so on. A modeling process may also consider shapes of recesses, numbers of recesses and/or an initial warpage of a substrate before a manufacturing process, for example. In addition to geometrical patterns of which surface-modifying material 520 may comprise, surface-modifying material 520 may also comprise one or more thicknesses upon different portions of substrate 510. For example, surface-modifying material 520 may have a thickness of 50 microns near edges of substrate 510 and a thickness of 30 microns over a center portion of substrate 510. Such a thickness variation over distance may be step-wise, linear, and/or non-linear, for example. Again, a modeling process may be used to determine such thicknesses in order to control warpage of substrate structure 500 during anticipated temperature changes during a manufacturing process. Of course, such geometries and dimensions of surface-modifying material are merely examples, and claimed subject matter is not so limited.

Figure 6:
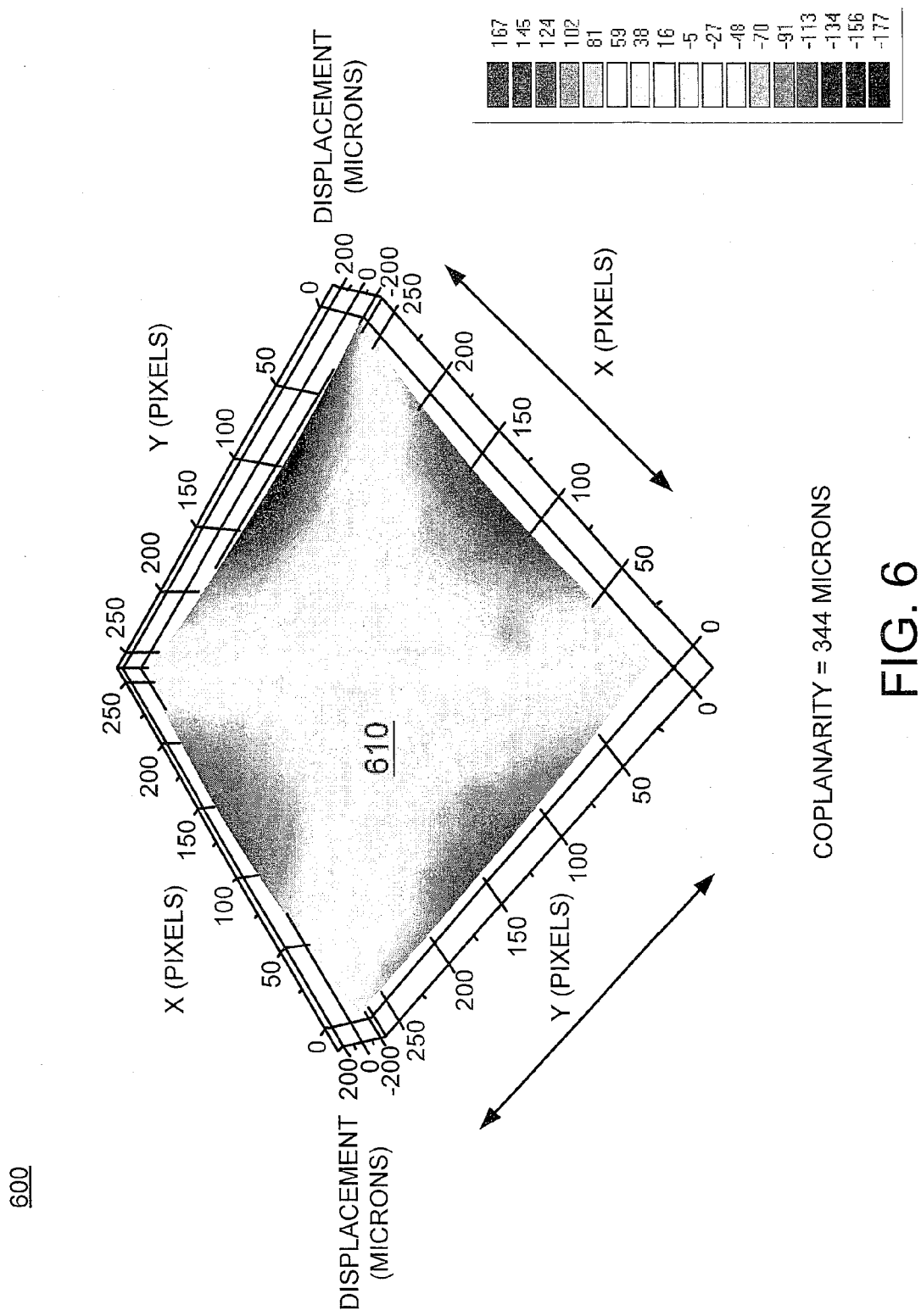
FIG. 6 is a plot of experimental data illustrating warpage of a first substrate, according to an embodiment.

FIG. 6 is a plot of experimental data 600 illustrating warpage of a first substrate 610 having no surface-modifying material, according to an embodiment. Such data, as plotted in the figure, may represent a surface topology of the substrate. In the experiment, substrate 610 comprised a 96% alumina substrate having a thickness of 0.4 millimeters. After an experimental temperature-changing process, data 600 indicates that substrate 610 concavely warped along a Y-direction and convexly warped in an X-direction. The degree of such warpage may lead to a relatively low manufacturing yield if substrate 610 were to be used in a manufacture of an integrated circuit, for example.

Figure 7:
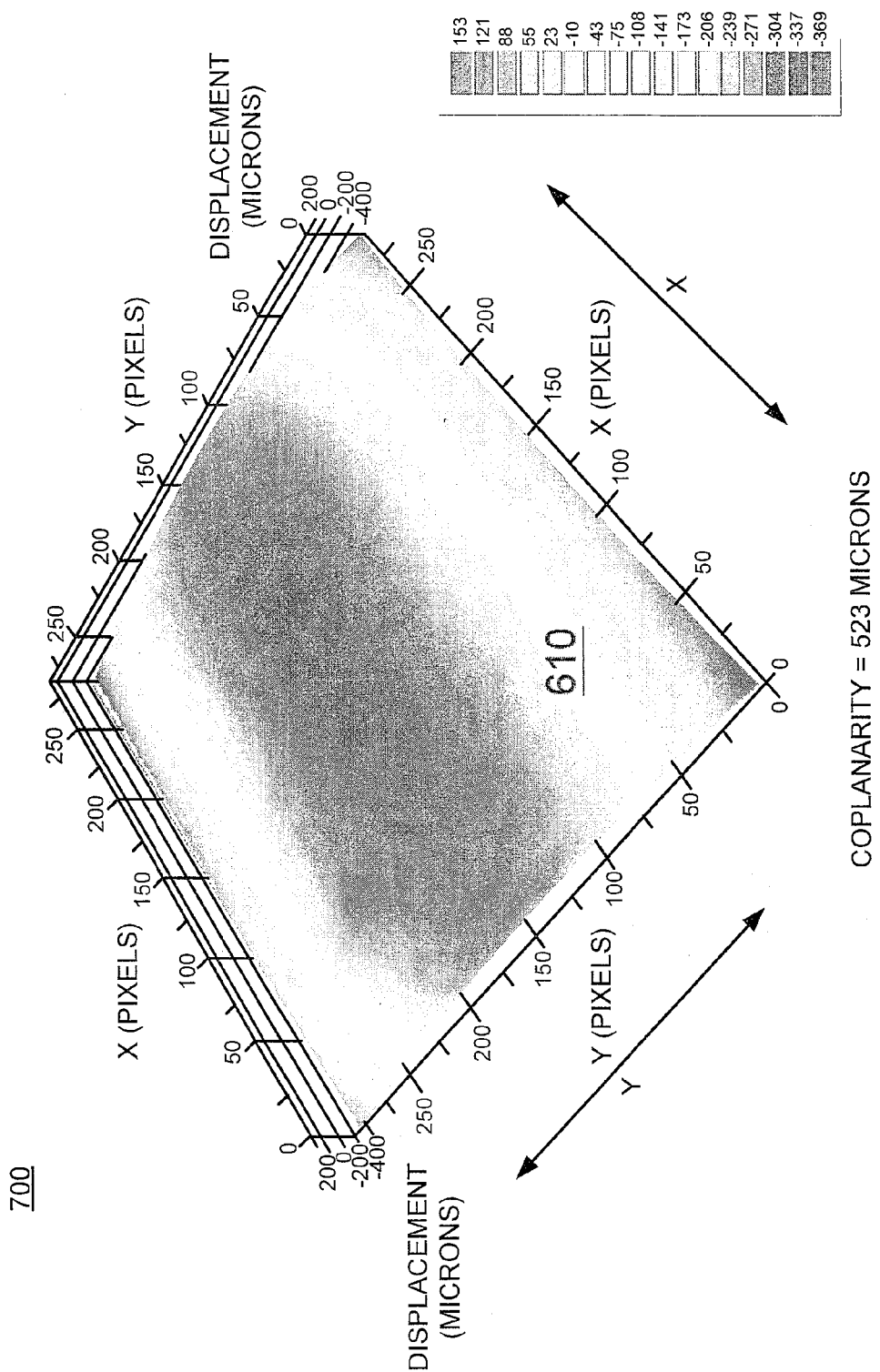
FIG. 7 is a plot of experimental data illustrating modified warpage of the first substrate including a single surface-modifying material layer on one side of the substrate, according to an embodiment.

FIG. 7 is a plot of experimental data 700 illustrating warpage of the first substrate 610 including a single surface-modifying material layer (not shown) on one side of the substrate, according to an embodiment. Characteristics of such warpage differ from those of the first substrate 610 having no surface-modifying material. For example, after an experimental temperature-changing process, data 700 indicates that substrate 610 convexly warped in a Y-direction. Again, the degree of such warpage may lead to a relatively low manufacturing yield if substrate 610 were to be used in a manufacture of an integrated circuit, for example. Accordingly, a single surface-modifying material layer on one side of substrate 610, though modifying a degree and direction of substrate warpage, may not result in an acceptable warpage reduction.

Figure 8:
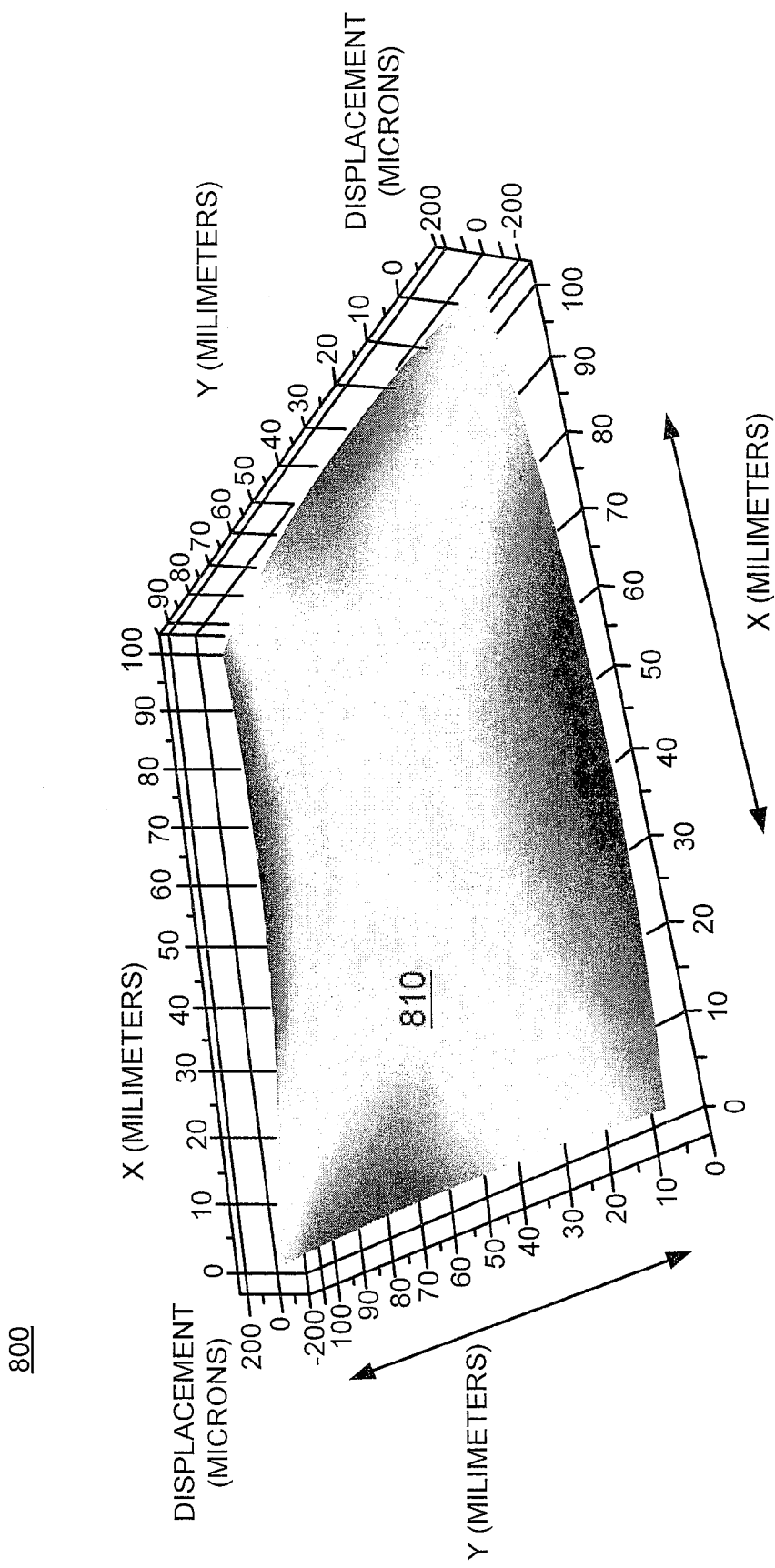
FIG. 8 is a plot of experimental data illustrating warpage of a second substrate, according to an embodiment.

FIG. 8 is a plot of experimental data 800 illustrating warpage of a second substrate 810 having no surface-modifying material, according to an embodiment. Such data, as plotted in the figure, may represent a surface topology of the substrate. In the experiment, substrate 810 comprised a 96% alumina substrate having a thickness of 0.4 millimeters. After an experimental temperature-changing process, data 800 indicates that substrate 810 concavely warped along an X-direction and convexly warped in a Y-direction. The degree of such warpage may lead to a relatively low manufacturing yield if substrate 810 were to be used in a manufacture of an integrated circuit, for example.

Figure 9:
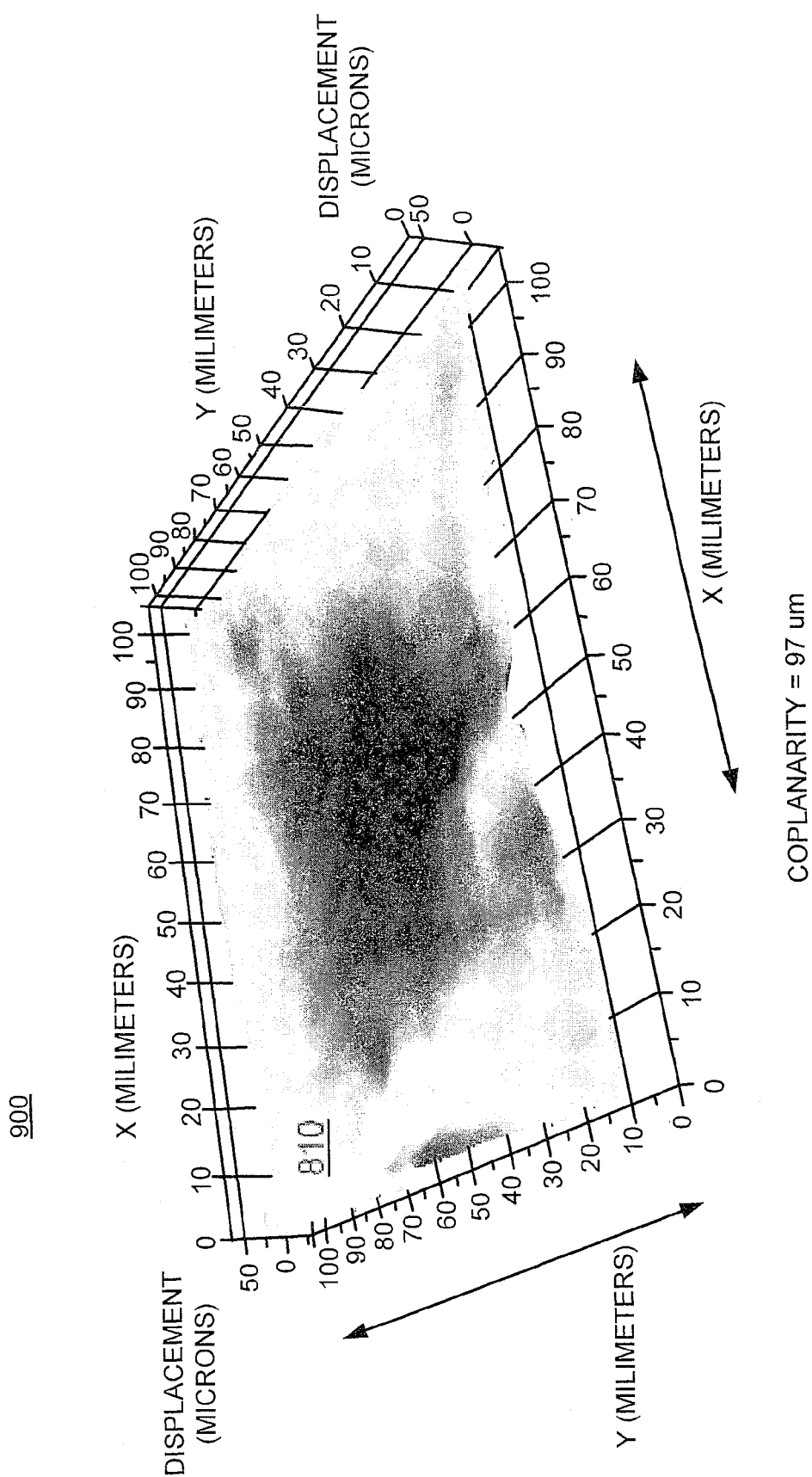
FIG. 9 is a plot of experimental data illustrating reduced warpage of the second substrate including surface-modifying materials on both sides of the substrate, according to an embodiment.

FIG. 9 is a plot of experimental data 900 illustrating modified warpage of the second substrate 810 including surface-modifying material layers on both sides of the substrate, according to an embodiment. After an experimental temperature-changing process, data 900 indicates that warpage has been substantially reduced for substrate 810, which experienced relatively minor concave warping in both X and Y-directions. Such a reduced degree of warpage may provide relatively high manufacturing yield if substrate 810, including surface-modifying material layers on both its sides, were to be used in a manufacture of an integrated circuit, for example. Accordingly, a surface-modifying material layer on both sides of substrate 810 may reduce and/or modify a degree of substrate warpage. Of course, such experimental data are merely examples of possible behavior of a substrate and surface-modifying material layers, and claimed subject matter is not so limited.

Figures 10, 11, 12:
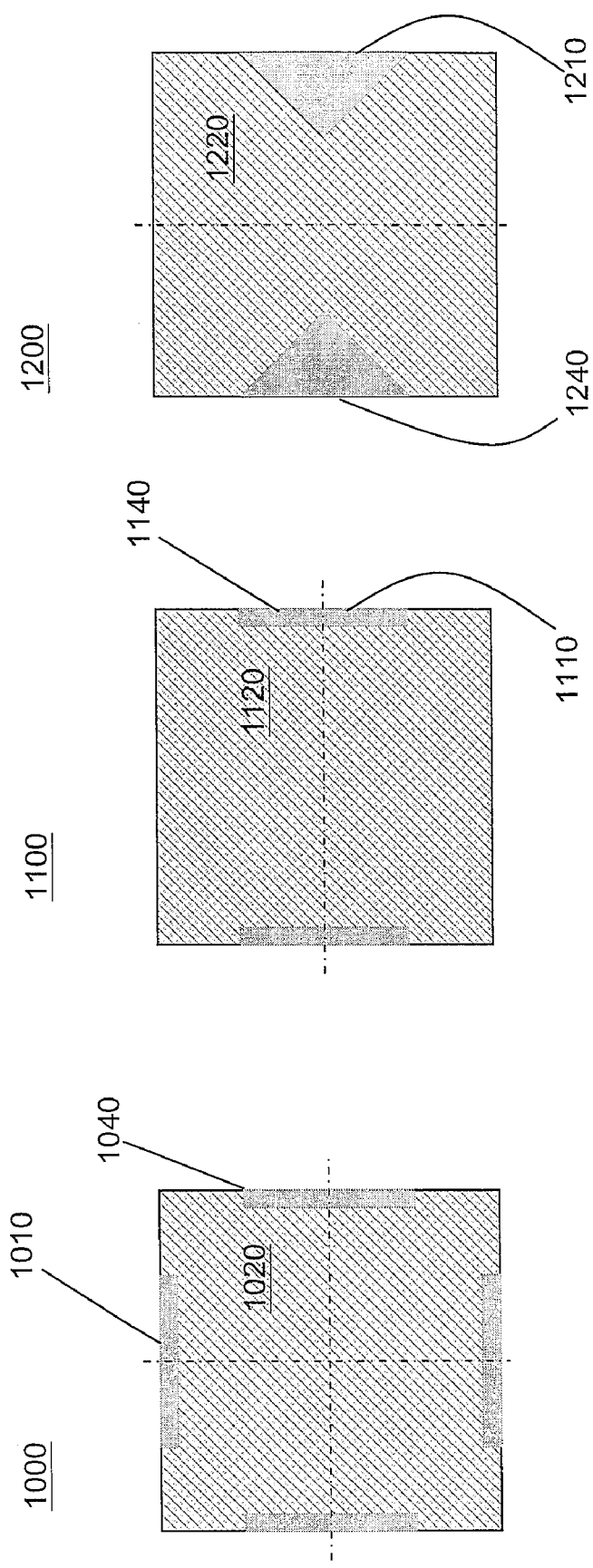
FIG. 10 is a plan view of a substrate structure including a patterned surface-modifying material, according to an embodiment.
FIG. 11 is a plan view of a substrate structure including a patterned surface-modifying material, according to another embodiment.
FIG. 12 is a plan view of a substrate structure including a patterned surface-modifying material, according to still another embodiment.

FIGS. 10, 11, and 12 are plan views of substrate structures that include a patterned surface-modifying material, according to an embodiment. Such substrate structures, during a temperature change for example, may warp in a particular fashion associated with the particular surface-modifying material pattern. Such various patterns may be selected for particular warpage direction and degree, for example. In FIG. 10, substrate structure 1000 may include surface-modifying material 1020 applied to substrate 1010. Surface-modifying material 1020 may include a pattern having one or more recesses 1040 along four sides of substrate 1010. In FIG. 11, substrate structure 1100 may include surface-modifying material 1120 applied to substrate 1110. Surface-modifying material 1120 may include a pattern having one or more recesses 1140 along two sides of substrate 1110. In FIG. 12, substrate structure 1200 may include surface-modifying material 1220 applied to substrate 1210. Surface-modifying material 1220 may include a pattern having one or more triangular recesses 1240 along sides of substrate 1210. Of course, such patterns are merely examples of substrate structure designs, and claimed subject matter is not so limited. Furthermore, thicknesses of surface-modifying materials 1020, 1120, and 1220 may be constant or vary depending upon position on substrate 1010, 1110, and 1210, respectively. Though a square-shaped substrate is shown in the figures, a substrate may comprise any shape or profile, such as circular, rectangular, and so on. Of course, such shapes and patterns of substrates and surface-modifying materials are merely examples, and claimed subject matter is not so limited.

One skilled in the art will realize that a virtually unlimited number of variations to the above descriptions is possible, and that the examples and the accompanying figures are merely to illustrate one or more particular implementations.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A device comprising:
   a substrate having a first coefficient of thermal expansion (CTE); and
   a first surface-modifying material having a second CTE, said first surface-modifying material disposed on a first surface of said substrate, wherein a change in an amount of warpage of said substrate is responsive, at least in part, to a difference between said first CTE and said second CTE during a temperature change of said device, and said first surface-modifying material is disposed on said first surface of said substrate in a first pattern that exposes portions of said first surface of said substrate so that said amount of warpage comprises a reduced amount of warpage, wherein said first pattern comprises a pattern of one or more different thicknesses of said first surface-modifying material.

2. The device of claim 1, wherein said first pattern comprises a pattern of one or more different thicknesses of said first surface-modifying material.

3. The device of claim 1, wherein said substrate comprises a ceramic substrate.

4. The device of claim 3, wherein said first surface-modifying material comprises polymer-based materials.

5. The device of claim 3, wherein said first surface-modifying material comprises a ceramic-based material and/or a metal-based material.

6. The device of claim 1, further comprising:

a second surface-modifying material having a third CTE, said second surface-modifying material disposed on a second surface of said substrate, wherein said second surface is opposite said first surface of said substrate, said change in said amount of warpage of said substrate is responsive, at least in part, to a difference between said third CTE and said second CTE during said temperature change of said device, and said second surface-modifying material is disposed on said second surface of said substrate in a second pattern that exposes portions of said second surface of said substrate so that said amount of warpage comprises said reduced amount of warpage.

7. The device of claim 6, wherein said second pattern comprises a pattern of one or more different thicknesses of said second surface-modifying material.

8. The device of claim 6, wherein said third CTE comprises substantially the same value as said first CTE.

* * * * *